United States Patent [19]
Kimura

[11] Patent Number: 5,381,113
[45] Date of Patent: Jan. 10, 1995

[54] DIFFERENTIAL AMPLIFIER CIRCUIT USING QUADRITAIL CIRCUIT

[75] Inventor: Katsuji Kimura, Tokyo, Japan

[73] Assignee: NEC Corporation, Tokyo, Japan

[21] Appl. No.: 149,556

[22] Filed: Nov. 9, 1993

[30] Foreign Application Priority Data

Nov. 9, 1992 [JP] Japan .................. 4-323690

[51] Int. Cl.[6] .............................. H03F 3/45
[52] U.S. Cl. .............................. 330/253; 330/261
[58] Field of Search ............ 330/253, 261; 307/494, 307/497, 501, 491

[56] References Cited

U.S. PATENT DOCUMENTS

| | | | |
|---|---|---|---|
| 4,460,874 | 7/1984 | Haque | 330/261 |
| 4,795,916 | 1/1989 | Liron | 307/494 |
| 5,128,630 | 7/1992 | Mijuskovic | 330/253 |
| 5,214,329 | 5/1993 | Furino, Jr. | 307/494 |
| 5,280,199 | 1/1994 | Itakura | 330/253 |

FOREIGN PATENT DOCUMENTS

| | | | |
|---|---|---|---|
| 0234655 | 9/1987 | European Pat. Off. | |
| 259879 | 3/1988 | European Pat. Off. | 330/253 |
| 0349205 | 1/1990 | European Pat. Off. | |

OTHER PUBLICATIONS

J. Haspeslagh et al., "Design Techniques for Fully Differential Amplifiers", Proceedings of the Custom Integrated Circuits Conference, New York, May 16–19, 1988, pp. 12.2.1–12.2.4.

Proceedings of the 1992 IEICE Fall Conference, Sep. 27–30, 1992, Tokyo, Japan.

A. Nedungadi et al., "Design of Linear CMOS Transconductance Elements", IEEE Transactions on Circuits and Systems, vol. CAS-31, No. 10, pp. 891–894.

*Primary Examiner*—Steven Mottola
*Assistant Examiner*—Tiep H. Nguyen
*Attorney, Agent, or Firm*—Sughrue, Mion, Zinn, Macpeak & Seas

[57] ABSTRACT

A differential amplifier circuit including a quadritail circuit and a differential pair of transistors. The quadritail circuit has a first pair of first and second MOS transistors, a second pair of third and fourth MOS transistors, and a constant current source for driving the first and second pairs. The differential pair is composed of fifth and sixth MOS transistors and driven by an output current of the quadritail circuit. An input voltage is applied between the gates of the first and second transistors and between the gates of the fifth and sixth transistors. A DC voltage is applied to the common-connected gates of the third and fourth transistors. An output current is derived from an output end of the differential pair. The transconductance linearity of the differential amplifier circuit can be improved.

16 Claims, 8 Drawing Sheets

DIFFERENTIAL AMPLIFIER CIRCUIT USING QUADRITAIL CIRCUIT

BACKGROUND OF THE INVENTION

1. Field of the Invention

The present invention relates to a differential amplifier circuit using a quadritail circuit, and more particularly to a differential amplifier circuit to be formed on Complementary Metal Oxide Semiconductor (CMOS) integrated circuits, which has an improved transconductance linearity.

2. Description of the Prior Art

In general, with a differential amplifier circuit formed on CMOS integrated circuits, its input voltage range is determined by the transconductance of the differential circuit formed at the input end of the differential amplifier circuit. Therefore, the differential circuit is required to have a transconductance with good linearity.

FIG. 1 shows a conventional differential amplifier circuit whose transconductance is good in linearity, which is disclosed by A. Nedungadi and T. R. Viswanathan in "IEEE TRANSACTIONS ON CIRCUITS AND SYSTEMS" Vol CAS-31, No 10, pp 891-894, October 1984, entitled "Design of Linear CMOS transconductance Elements". FIG. 2 shows the squaring circuit used in the differential amplifier circuit. It seems that there are some mistakes about the operation analysis in the document, so that the corrected operation analysis of the circuit is described below.

In FIGS. 1 and 2, N-channel MOS transistors M21 and M22 compose a first pair and N-channel MOS transistors M23 and M24 compose a second pair. The first pair is driven by a constant current source 21 which is connected to the common-connected sources of the transistors M21 and M22 and generates a constant current (n+1)I. The second pair is driven by a constant current source 22 which is connected to the common-connected sources of the transistors M23 and M24 and generates a constant current (n+1)I.

The transconductance parameters of the transistors M21 and M22 are k and those of the transistors M23 and M24 are n times as much as k, or nk. The MOS transistor with the transconductance parameter nk is generally realized by n in number of the unit transistors with the transconductance parameter k which are connected in parallel.

N-channel MOS transistors M26 and M27 whose sources are connected in common at a point D compose a differential pair, which is driven by a constant current source 23. The current source 23 is connected to the differential pair at the point D and generates a constant current aI. The transconductance parameters of the transistors M26 and M27 are k.

The drains of the transistors M21 and M22 are connected in common at a point C, and between the drains thus common-connected and a voltage source (voltage: V), there is provided with a constant current source 24 which generates a constant current aI. An N-channel MOS transistor 25 whose drain and gate is connected to each other is provided between the points C and D. The transistor M25 serves as a current level shifter for shifting the current level at the point C to that at the point D.

The gates of the transistors M26, M21 and M23 are connected in common to be applied with a first input voltage $V_1$. The gates of the transistors M27, M22 and M24 are connected in common to be applied with a second input voltage $V_2$.

P-channel MOS transistors M28 and M29 compose a current mirror circuit serving as an active load of the differential amplifier circuit. An output current i of the differential amplifier circuit is derived from the drain of the transistor M29.

Next, the operation of the conventional differential amplifier circuit will be explained below.

The transconductance parameter k is expressed as $k=(\frac{1}{2})(W/L)\mu C_{ox}$, where $\mu$ is the effective surface carrier mobility, $C_{ox}$ is a gate-oxide capacity per unit area, W is a gate width and L is a gate length of each of the transistors.

Assuming that all the MOS transistors are operating in their saturation regions, the drain current $I_D$ of each transistor is expressed by the following equation (1), where $V_{GS}$ is the gate-to-source voltage and $V_{TH}$ is the threshold voltage of each transistor.

$$I_D = k(V_{GS} - V_{TH})^2 \quad (1)$$

Consider now a source-coupled N-channel differential pair biased by a current sink 2I, the differential input voltage ($V_1 - V_2$) is expressed as v and the drain current $I_D$ is expressed as $I \pm i$, where I is a direct current component and i is a signal component varying in accordance with the differential input voltage v. Assuming that the transistors is matched in characteristic to each other, the large signal v-i characteristic (input-output characteristic) is expressed as the following equations (2-1) and (2—2).

$$i = 2i_1 = (2kI)^{\frac{1}{2}} \cdot v \cdot [1 - \{kv^2/(4I)\}]^{\frac{1}{2}} \quad (2\text{-}1)$$

$$|v| \leq (2I/k)^{\frac{1}{2}}$$

$$i = 2I \cdot sgn(v) \quad |v| > (2I/k)^{\frac{1}{2}} \quad (2\text{-}2)$$

Here, to normalize the equations (2-1) and (2—2), $V_b$, x and y are expressed as $V_b = (I/k)^{\frac{1}{2}}$, $x = (v/V_b)$ and $y = (i/I)$, respectively. As a result, the following equations (3-1) and (3-2) are obtained.

$$y = 2x \cdot \{1 - (x^2/4)\}^{\frac{1}{2}} \quad |x| \leq 2^{\frac{1}{2}} \quad (3\text{-}1)$$

$$y = 2 \cdot sgn(x) \quad |x| > 2^{\frac{1}{2}} \quad (3\text{-}2)$$

Next, the term $\{1 - (x^2/4)\}^{\frac{1}{2}}$ in the equation (3-1) is made constant. As shown in FIG. 2, which shows the squring circuit modified by the inventor, the drain currents $I_{D21}$ and $I_{D22}$ of the transistors M21 and M22 are expressed as $$I_{D21} = I + i_1$$

and $$I_{D22} = I - i_2,$$

so that ($I_{D21}/I$) and ($I_{D22}/I$) are given as the following equations (4-1) and (4-2), respectively.

$$(I_{D21}/I) = 1 + y_1 = 1 + (i_1/I) = 1 + \gamma x^2 + (\alpha x/2)(1 - \beta x^2)^{\frac{1}{2}} \quad (4\text{-}1)$$

$$(I_{D22}/I) = 1 - y_2 = 1 - (i_2/I) = 1 + \gamma x^2 - (\alpha x/2)(1 - \beta x^2)^{\frac{1}{2}} \quad (4\text{-}2)$$

$Y = (i/I) = (i_1 - j_2)/I$, so that the following equations (5-1)(5-2) and (5-3) can be obtained.

$$y = 2(1 + \gamma x^2)|x| \leq \{(n+1)/n\}^{\frac{1}{2}} \quad (5\text{-}1)$$

$$y = -2n + \gamma x^2 + (\alpha/2)|x|(1 - \beta x^2)^{\frac{1}{2}} \quad (5\text{-}2)$$

$$\{(n+1)/n\}^{\frac{1}{2}} < |x| \leq (n+1)^{\frac{1}{2}}$$

$$Y = 0 \quad |x| > (n+1)^{\frac{1}{2}} \quad (5\text{-}3)$$

Using the equation (5-1), the sum of the drain currents $I_{D1}$ and $I_{D2}$ is given as $$\begin{aligned}I_{D1}+I_{D2} &= 2I(i+\gamma x^2) \\ &= 2I + 2k\{n(n+1)/(n+1)^2\}v^2|v| \leq \{(n+1)I/(kn)\}^{\frac{1}{2}}\end{aligned} \quad (6)$$

If the transistor M25 is ignored and the differential pair of the transistors M26 and M27 are driven by the current $2I_s$, the output current i can expressed as the following equation (7) by using the equation (3-1).

$$i = v\{k(4I_s - kv^2)\}^{\frac{1}{2}} \quad (7)$$

If the driving current $2I_s$ is defined as $$2I_s = 2I + k'v^2, \quad (8)$$

the output current i is expressed as the following equation (9) by using the equation (7).

$$i = v[k\{(4I - (k-2k')v^2\}]^{\frac{1}{2}} \quad (9)$$

In order to make the output current i constant, independent of the differential input voltage v, the constants k and k' are required to satisfy the following equation (10).

$$k' = \{2n(n-1)/(n+1)^2\}k \quad (10)$$

For example, if $k' = (k/2)$ in the equation (10), $n = 1 + (2/3^{\frac{1}{2}}) \approx 2.1547 \approx 2.155$. As a result, when the differential input voltage is in the range of $\{v\{\leq V_b\{(n+1)/n\}^{\frac{1}{2}}$, the transconductance of the differential pair of the transistors M26 and M27 can be made linear.

Concretely, the normalized voltage x is in the range of $|x| \leq (1/n)^{\frac{1}{2}} \approx 0.68$, the linearity of transconductance of the differential pair can be ensured.

In the case, the coefficient a of the constant current sources 23 and 24 is given as $$a = (n+1)/4n \approx 2.32.$$

As described above, with the conventional differential amplifier circuit shown in FIG. 1, the non-linearity of the input-output characteristic of the differential amplifier circuit is compensated by using the squaring circuit shown in FIG. 2. However, the input voltage range of the squaring circuit, in which the exact square-law characteristic can be obtained, is narrow, so that the input voltage range of the differential amplifier circuit, in which linearity of the transconductance can be ensured, is limited to $|x| \leq 0.68$. As a result, such the input range has been demanded to be expanded.

In addition, in the squaring circuit in FIG. 2, the transconductances of the transistors M23 and M24 are n times in value as much as those of the transistors M21 and M22. Therefore, when n=2.155, for example, it is required that 200 in numbers of unit transistors are formed as the transistor M21 and 431 in numbers of the unit transistors are formed as the transistor M24 on a semiconductor substrate. Similarly, with the transistors M22 and M23 and the current sources 21 and 22, the same numbers of the unit transistors are required. This is not realistic.

SUMMARY OF THE INVENTION

Accordingly, an object of the present invention is to provide a differential amplifier circuit which has a linear transconductance in a wider range than the conventional one.

Another object of the present invention is to provide a differential amplifier circuit which can be formed on a CMOS integrated circuits.

A differential amplifier circuit according to a first aspect of the present invention includes a quadritail circuit and a differential pair of transistors.

The quadritail circuit comprises a first transistor pair of first and second MOS transistors, a second transistor pair of third and fourth MOS transistors, and a constant current source for driving the first and second pairs.

The differential pair is composed of fifth and sixth MOS transistors and is driven by a current twice in value as much as the output current of the quadritail circuit.

An input voltage is differentially applied between the gates of the first and second transistors and between the gates of the fifth and sixth transistors. A direct curent (DC) voltage, for example, the middle point voltage of the input voltage, is applied to the common-connected gates of the third and fourth transistors of the second pair. An output current is derived from an output end of the differential pair.

With the differential amplifier circuit of the first aspect, the quadritail circuit includes the first and second pairs and the constant current source for driving the both pairs. The quadritail circuit has a good square-law characteristic in a wider input voltage range than that of the prior art squaring circuit shown in FIG. 2, so that the linearity of the transconductance of the differential circuit can be improved.

Additionally, since the first and second pairs and the differential pair is each composed of the MOS transistors, the differential amplifier circuit can be realized on CMOS integrated circuits easily.

A differential amplifier circuit of a second aspect of the present invention includes a quadritail circuit and a differential pair of MOS transistors, similar to that of the first aspect. However, it is different from that of the first aspect in that the differential pair is driven by a current equal in value to the sum of the current of the constant current source and the output current of the quadritail circuit.

The same advantages or effects as those of the first aspect can be obtained.

A differential amplifier circuit according to a third aspect of the present invention includes a quadritail circuit and a differential pair of MOS transistors, similar to that of the first aspect. However, it further includes a second constant current source connected to the common-connected drains of the first and second transistors, a third constant current source for driving the differential pair and a current level shifter for shifting a current level between the common-connected drains of the first and second transistors and those of the fifth and sixth transistors.

There is an advantage that the input voltage range in which the linearity of the transconductance is good can be changed by adjusting the current values of the current sources.

A differential amplifier circuit of a fourth aspect of the present invention also includes a quadritail circuit and a differential pair of MOS transistors. However, it is different from that of the first aspect in the following: First, the differential pair is driven by a current equal in value to the output current of the quadritail circuit. Second, an input voltage is applied between the gates of the first and second transistors and a voltage obtained by changing the voltage level of the input voltage is applied between the gates of the fifth and sixth transistors, and vice versa.

Since the differential circuit is driven by the current equal in value to the output current of the quadritail circuit, there is an advantage that current consumption can be reduced compared with those of the first to third aspects.

In the differential amplifier circuits of the first to fourth aspects, as the driving current for the differential circuit, one of the output currents derived from the two output ends of the quadritail circuit or the differential output current thereof may be used.

Preferably, the transconductance parameters of the first and second transistor, and the third and fourth transistors are equal to each other, respectively. However, they may be different from each other, respectively.

DETAILED DESCRIPTION OF THE PREFERRED EMBODIMENTS

Preferred embodiments of the present invention will be described below referring to FIGS. 3 to 10.

FIRST EMBODIMENT

FIGS. 3 to 6 shows a differential amplifier circuit of a first embodiment.

Figure 3:
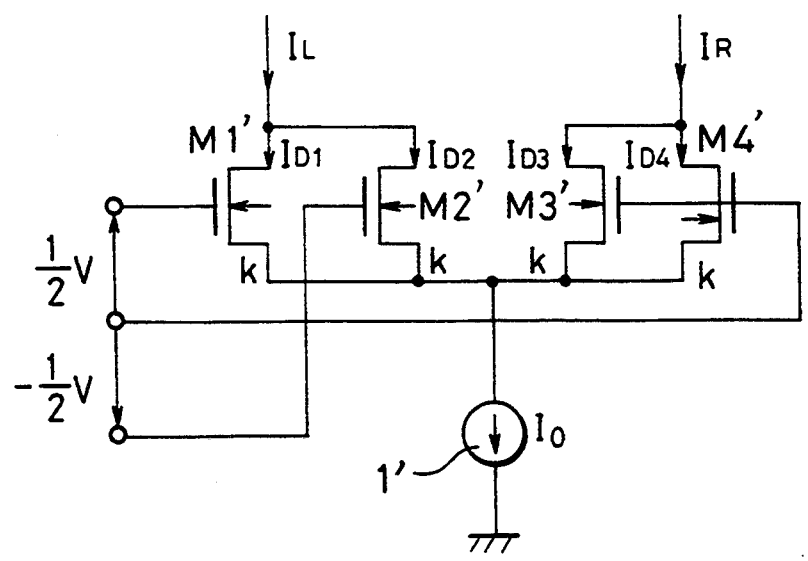
FIG. 3 is a circuit diagram of a differential circuit (quadritail circuit) used in a differential amplifier circuit according to a first embodiment of the present invention.

In a differential circuit or quadritail circuit shown in FIG. 3, a first transistor pair is composed of N-channel MOS transistors M1' and M2' whose drains are connected in common, and a second transistor pair is composed of N-channel MOS transistors M3' and M4' whose drains are connected in common. The sources of the transistors M1', M2', M3' and M4', are connected in common to a constant current source 1' (current: $I_o$) for driving the first and second transistor pairs. The gates of the third and fourth transistors are connected in common. The transconductance parameters of the transistors M1', M2', M3', and M4' are k.

With the common-connected gates of the transistors M3' and M4' being as the standard, a first input voltage $+(\frac{1}{2})v$ is applied to the gate of the transistor M1' and a second input voltage $-(\frac{1}{2})v$, which is equal in absolute value and opposite in phase to the first input voltage, is applied to the gate of the transistor M2'.

In other words, the common-connected gates of the transistors M3' and M4' is biased by the middle point voltage of the voltage applied between the gates of the transistors M1' and M2', or v. The voltage v is applied between the gates of the transistors M1' and M2'.

Next, the operation of the quadritail circuit will be shown below.

The gate-to-source voltages of the transistors M1', M2', M3' and M4' are expressed as $V_{GS1}$, $V_{GS2}$, $V_{GS3}$ and $V_{GS4}$ respectively, the threshold voltages of the transistors are $V_{TH}$, the drain currents $I_{D1}$, $I_{D2}$, $I_{D3}$ and $I_{D4}$ of the transistors M1', M2', M3' and M4' can be expressed as the following equations (11-1), (11-2) and (11-3).

$$I_{D1} = k(V_{GS1} + v/2 - V_{TH}) \tag{11-1}$$

$$I_{D2} = k(V_{GS2} - v/2 - V_{TH}) \tag{11-2}$$

$$I_{D3} = I_{D4} = k(V_{GS3} - V_{TH}) \tag{11-3}$$

Here, the following equation (11-4) is established, and a current $I_L$ flowing through the common-connected drains of the transistors M1' and M2' and a current $I_R$ flowing through the common-connected drains of the transistors M3' and M4' are expressed as the following equations (11-5) and (11-6), respectively.

$$I_{D1} + I_{D2} + I_{D3} + I_{D4} = I_o \tag{11-4}$$

$$I_L = I_{D1} + I_{D2} \tag{11-5}$$

$$I_R = I_{D3} + I_{D4} \tag{11-6}$$

From the equations (11-4), (11-5) and (11-6), it is seen that the currents $I_L$ and $I_R$ change in the following ranges, respectively.

$$(I_o/2) \leq I_L \leq I_o \tag{12-1}$$

$$0 \leq I_R \leq (I_o/2) \tag{12-2}$$

If the equations (11-1), (11-2), (11-3), (11-4), (11-5) and (11-6) are solved, the currents $I_L$ and $I_R$ are expressed as the following equations (13-1) and (13-2).

$$I_L = (I_o/2) + (kv^2/4)|v| \leq (2I_o/3k)^{\frac{1}{2}} \tag{13-1}$$

$$I_R = (I_o/2) - (kv^2/4)|v| \leq (2I_o/3k)^{\frac{1}{2}} \tag{13-2}$$

From the equations (13-1) and (13-2), it is seen that both of the currents $I_L$ and $I_R$ have the square-law characteristics in the range of $|v| \leq (2I_o/3k)^{\frac{1}{2}}$.

Therefore, the differential output current $\Delta I_{QC}$ of the quadritail circuit is expressed as the following equation (14).

$$\Delta I_{QC} = I_L - I_R = kv^2/2 \quad |v| \leq (2I_o/3k)^{\frac{1}{2}} \qquad (14)$$

Figure 4:
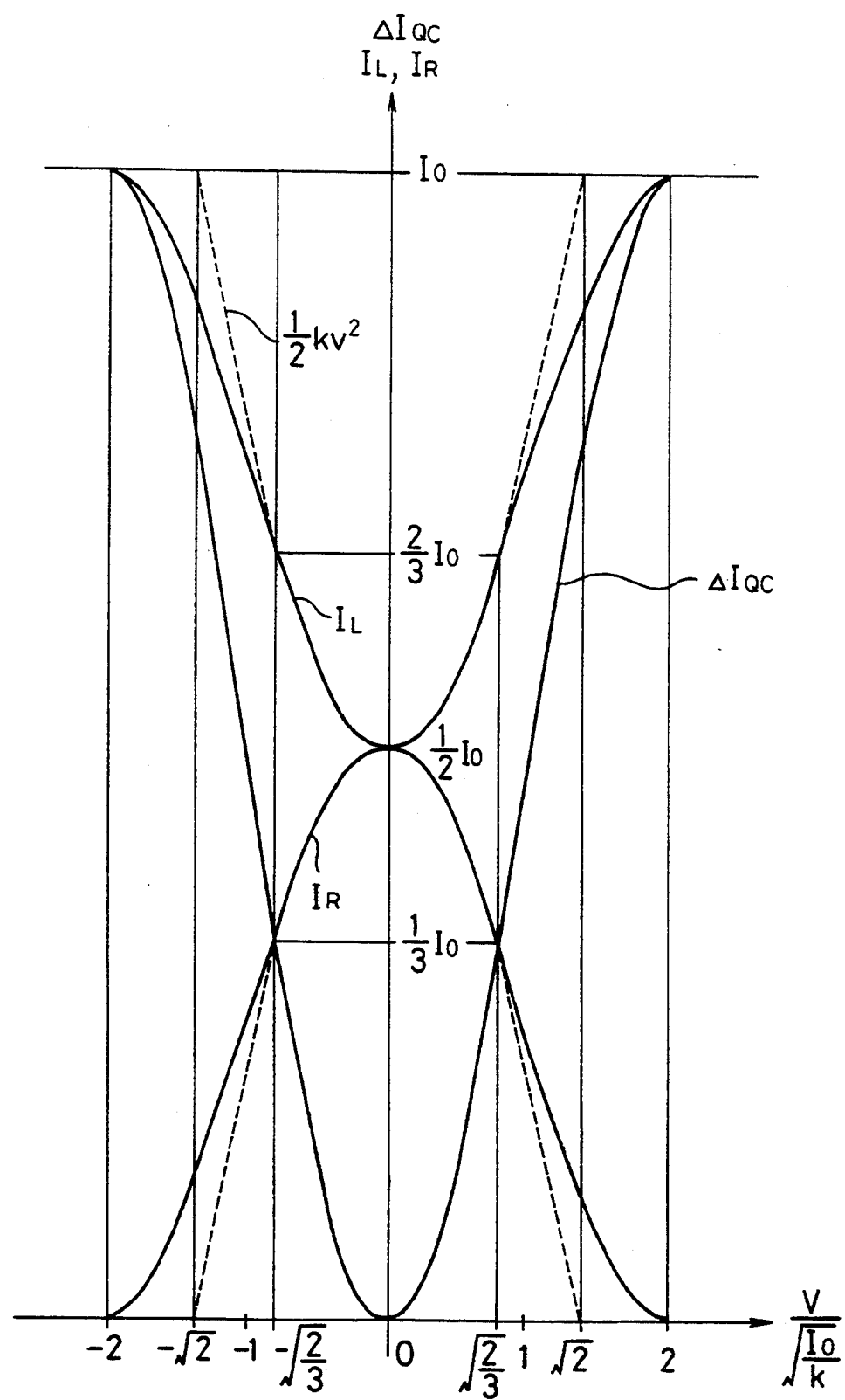
FIG. 4 shows an input-output characteristics of the differential circuit (quadritail circuit) shown in FIG. 3.

The input-output characteristics of the quadritail circuit is shown in FIG. 4. The abscissa of the graph in FIG. 4 shows the normalized input voltage $\{v/(I_o/k)^{\frac{1}{2}}\}$.

Figure 2:
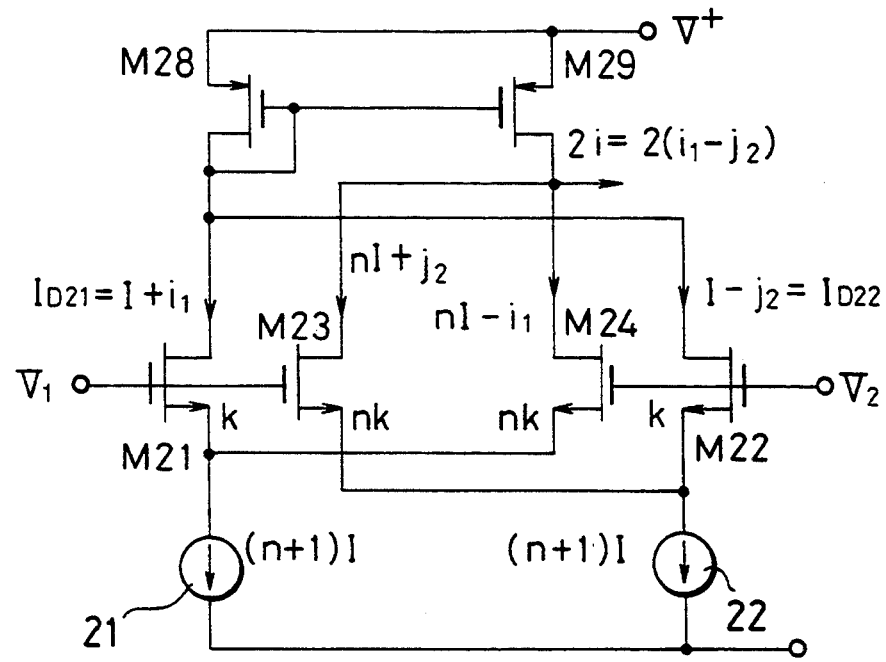
FIG. 2 is a circuit diagram of the squaring circuit contained in the conventional differential amplifier circuit shown in FIG. 1, which is modified by the inventor.

It is seen that from FIG. 4 the differential output current $\Delta I_{QC}$ has a good square-law characteristic in the range of $|v/(k/I_o)^{\frac{1}{2}}| \leq (\frac{2}{3})^{\frac{1}{2}} \approx 0.816$. This means that the input voltage range showing the good square-law characteristic is expanded compared with that (approximately 0.68) of the conventional squaring circuit shown in FIG. 2.

Figure 5:
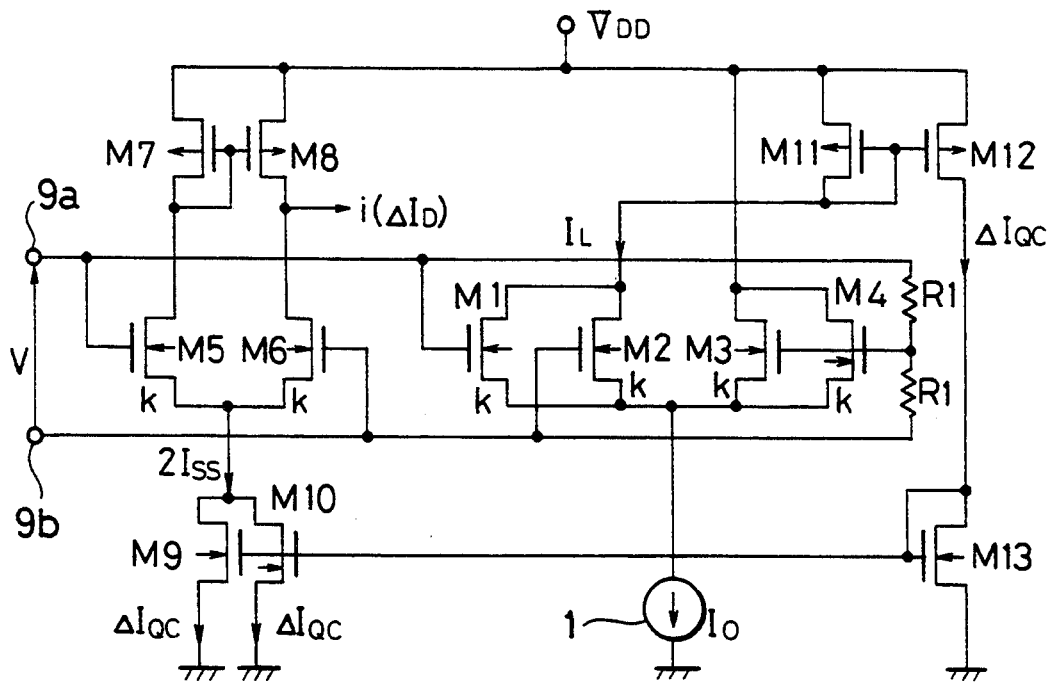
FIG. 5 is a circuit diagram of a differential amplifier circuit according to the first embodiment.

FIG. 5 shows the differential amplifier circuit according to the first embodiment using a quadritail circuit, which includes a quadritail circuit and a differential pair of MOS transistors.

In the quadritail circuit, a first transistor pair is composed of N-channel MOS transistors M1 and M2 whose drains are connected in common, and a second transistor pair is composed of N-channel MOS transistors M3 and M4 whose drains are connected in common. The sources of the transistors M1, M2, M3 and M4 are connected in common and between the sources thus common-connected and the ground, there is provided with a constant current source 1 (current: $I_o$) for driving the first and second transistor pairs.

The transconductances parameters of the transistors M1, M2, M3 and M4 are equal to be k.

The gate of the transistor M1 is connected to one terminal 9a of an input terminal pair and the gate of the transistor M2 is connected to the other terminal 9b of the input terminal pair. The gates of the transistors M3 and M4 are connected in common to be connected to the gate of the transistor M1 through a first resistor. The common-connected gates of the transistors M3 and M4 are connected to the gate of the transistor M2 through a second resistor. The resistance of the first and second resistors are equal to be $R_1$.

An input voltage v is applied between the gates of the transistors M1 and M2 with the gate of the transistor M2 being as the standard. The common-connected gates of the transistors M3 and M4 are biased by the middle point voltage $(\frac{1}{2})v$ of the input voltage V.

The drains of the transistors M1 and M2 are connected in common and between the drains thus common-connected and a voltage source (voltage $V_{DD}$) a current mirror circuit is provided. The current mirror circuit is composed of P-channel MOS transistors M11 and M12 acting as an active load of the quadritail circuit. The common-connected drains of the transistors M1 and M2 are connected to the drain and gate of the transistor M11. The drains of the transistors M3 and M4 are connected in common to the voltage source.

The differential output current $\Delta I_{QC}$ of the quadritail circuit is derived from the drain of the transistor M12 of the current mirror circuit.

The differential pair is composed of N-channel MOS transistors M5 and M6 whose transconductance parameters are equal to be k. The sources of the transistors M5 and M6 are connected in common to each other, and between the sources thus common-connected and the ground there are provided with N-channel MOS transistors M9 and M10, which act as a current source for driving the differential pair. The gates of the transistors M5 and M6 are connected to the terminals 9a and 9b, respectively, so that the differential input voltage v is applied between the gates of the transistors M5 and M6.

The drains and gates of the transistors M9 and M10 are connected to each other, respectively, and the sources thereof are grounded. The drains of the transistor M9 and M10 are connected to the common-connected sources of the transistors M5 and M6 and the common-connected sources of the transistors M9 and M10 are connected to the gate of an N-channel MOS transistor M13. The gate and drain of the transistor M13 are connected to each other and the source thereof is grounded. The drain of the transistor M13 is further connected to the drain of the transistor M12.

The transistors M13, M9 and M10 form a current mirror circuit. The transistors M9 and M10 is driven by the drain current of the transistor M13, that is the differential output current $\Delta I_{QC}$ of the quadritail circuit, thereby supplying a driving current twice in value as much as the current $\Delta I_{QC}$ to the differential pair of the transistors M5 and M6.

In the embodiment, $\Delta I_{QC} = I_L$ is established, so that the differential pair is driven by a current of $2I_L$ ($=2I_{SS}$).

There are provided with P-channel MOS transistors M7 and M8 between the voltage source and the differential pair. The transistors M7 and M8 form a current mirror circuit acting as an active load of the differential pair. The drains of the transistors M7 and M8 are connected to the drains of the transistors M5 and M6, respectively, the sources thereof are connected to the voltage source, and the gates thereof are connected in common to the drain of the transistor M7. A differential output current of the differential amplifier circuit $i(\Delta I_D)$ is derived from the drain of the transistor MS. With the differential amplifier circuit of the first embodiment, the differential pair of the transistors M5 and M6 is driven by the current $2I_{SS}$, so that the current $\Delta I_D$ is expressed as the following equations $$i = v\{k(4I_{SS} - kv^2)\}^{\frac{1}{2}} \qquad (151)$$

Here, $I_{SS} = \Delta I_{QC} = I_L$ is established, so that the following equation (16) is obtained by using the equation (13-2).

$$i = v(2kI_o)^{\frac{1}{2}} \quad |v| \leq (2I_o/3k)^{\frac{1}{2}} \qquad (16)$$

As a result, from the equation (16), the transconductance $g_m$ is expressed as the following equation (17).

$$g_m = di/dv = (2kI_o)^{\frac{1}{2}} \quad |v| \leq (2I_o/3k)^{\frac{1}{2}} \qquad (17)$$

Figure 6:
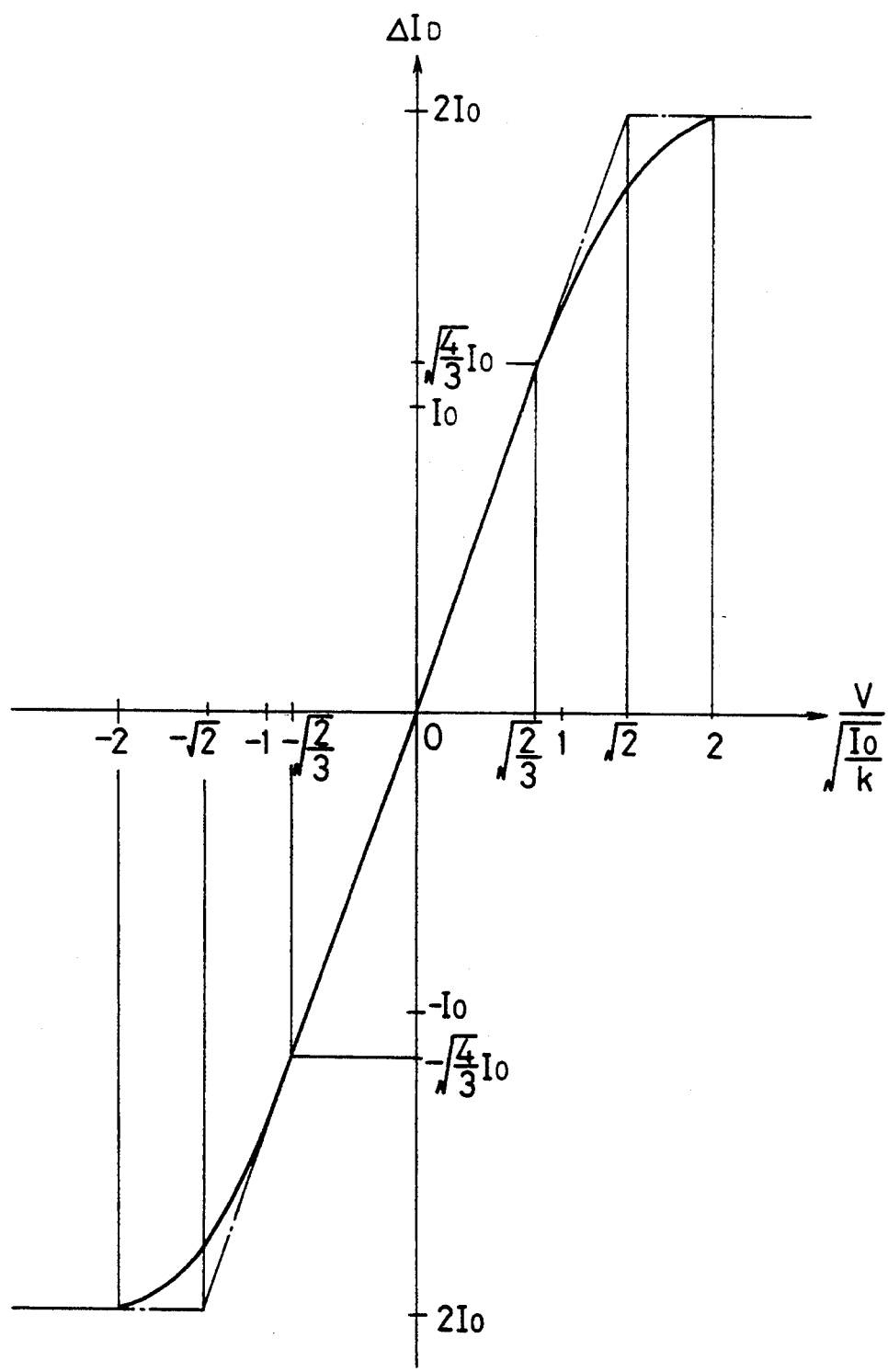
FIG. 6 shows an input-output characteristics of the differential amplifier circuit shown in FIG. 5.

FIG. 6 shows the input-output characteristic of the differential amplifier circuit, in which the abscissa indicates the normalized input voltage, similar to FIG. 4.

From FIG. 6, it is seen that the transconductance $g_m$ has a good linearity in the range of $|v| \leq (2I_o/3k)^{\frac{1}{2}}$. This means that the input voltage range showing the exactly linear transconductance $g_m$ is expanded compared with that of the conventional differential amplifier circuit shown in FIG. 1.

As described above, with the differential amplifier circuit of the first embodiment, the differential output current of the quadritail circuit drives the differential pair of the transistors M5 and M6, so that linearity of the transconductance can be ensured in the input voltage range of the quadritail circuit.

Additionally, the differential amplifier circuit may be composed of N- and P-channel MOS transistors having the same transconductances, it can be realized on CMOS integrated circuits easily.

SECOND EMBODIMENT

Figure 7:
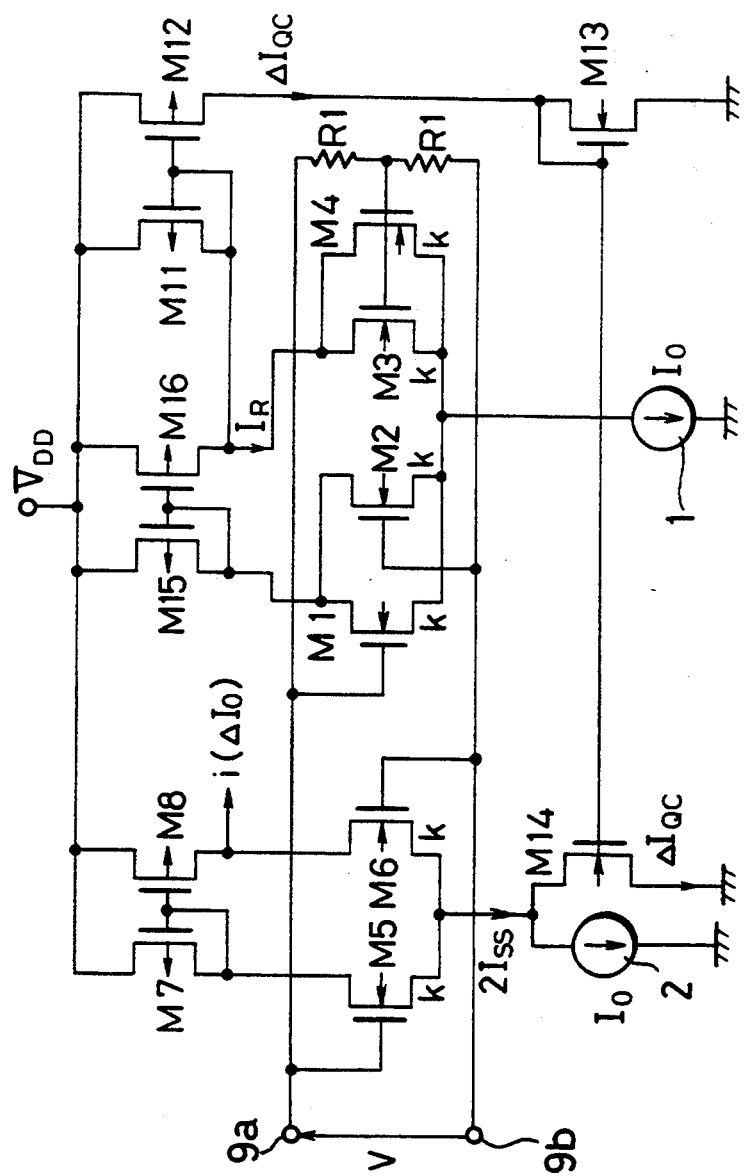
FIG. 7 is a circuit diagram of a differential amplifier circuit according to a second embodiment.

FIG. 7 shows a differential amplifier circuit of a second embodiment. Similar to the first embodiment, the circuit includes a quadritail circuit and a differential pair of MOS transistors. However, it is different from that of the first embodiment in that the differential pair composed of the transistors M5 and M6 is driven by a constant current source 2 (current: $I_o$) and an N-channel MOS transistor M14 connected in parallel and that a current mirror circuit composed of P-channel MOS transistors M15 and M16 is provided as an active load of the quadritail circuit.

The differential output current $\Delta I_{QC}$ of the quadritail circuit is derived from the current mirror circuit of the transistors M11 and M12 through the current mirror circuit of the transistors M15 and M16. The current $\Delta I_{QC}$ drives the transistor M14 through the transistor M13 to generate a current equal in value to the current $\Delta I_{QC}$. Therefore, the driving current $2I_{SS}$ for the differential pair satisfies the equation as $2I_{SS} = I_o + \Delta I_{QC}$. This means that the differential pair of the transistors M5 and M6 is driven by a current equal in value to the sum of the current $I_o$ of the constant current source 1 and the output current $\Delta I_{QC}$ of the quadritail circuit.

With the differential amplifier circuit of the second embodiment, the same equation as the equation (16) can be obtained, so that the circuit has the same input-output characteristics as shown in FIG. 6.

THIRD EMBODIMENT

Figure 8:
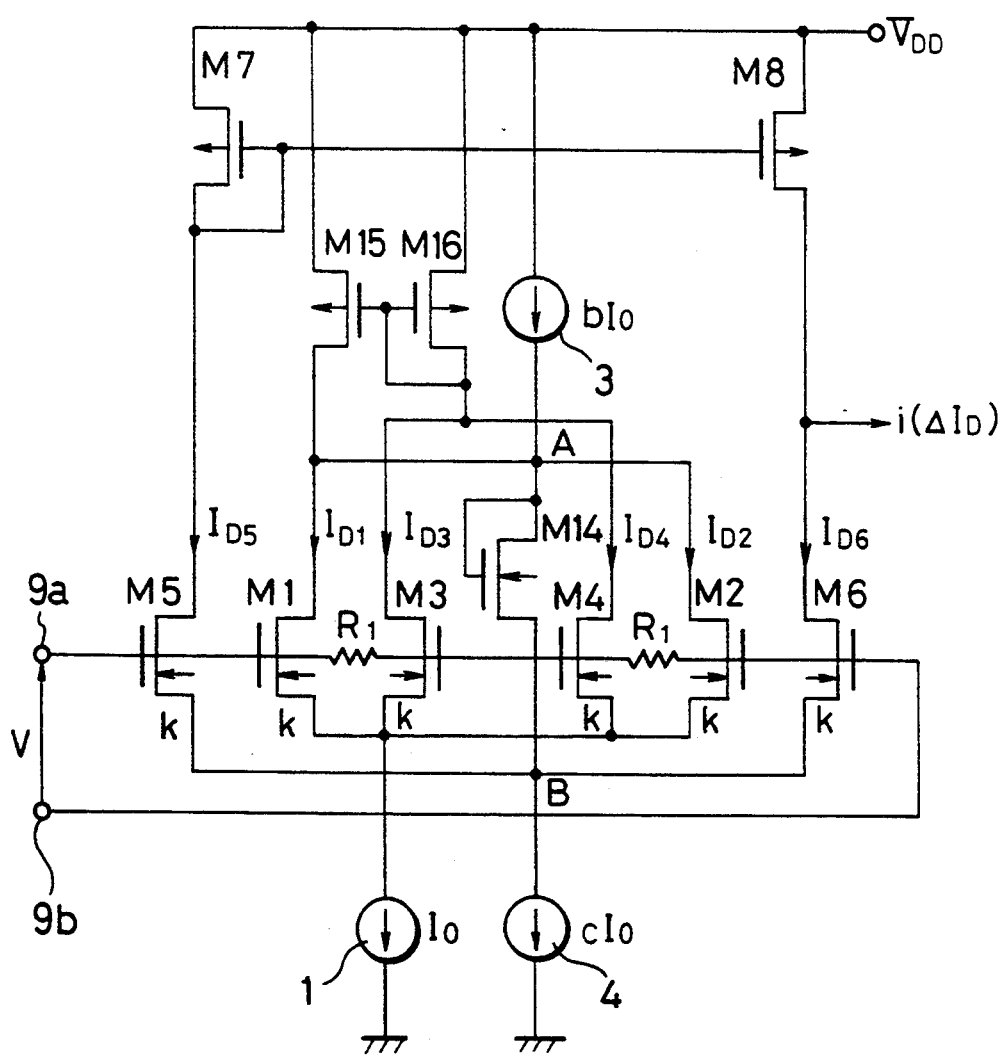
FIG. 8 is a circuit diagram of a differential amplifier circuit according to a third embodiment.

FIG. 8 shows a differential amplifier circuit of a third embodiment. The circuit is similar in configuration to the first embodiment with respect to the transistors M1 to M4, the first and second resistors and the first constant current source 1, which forms the quadritail circuit, and the current mirror circuit composed of the transistors M7 and M8, which acts an active load of the differential pair of the transistors M5 and M6. However, it has the following differences:

First, there is provided with a current mirror circuit composed of P-channel MOS transistors M15 and M16 between the quadritail circuit and the voltage source acting as an active load of the quadritail circuit, instead of the transistors M11 and M12.

Second, between the common-connected drains of the transistors M1 and M2 and the common-connected sources of the transistors M5 and M6, there is provided with an N-channel MOS transistor M14 whose drain and gate are connected to each other. The transistor M14 is, similar to the transistor M25 of the conventional differential amplifier circuit shown in FIG. 1, a current level shifter for shifting a current level between the common-connected drains (or at a point A) of the transistors M1 and M2 and the common-connected sources (or at a point B) of the transistors M5 and M6.

Third, there is a constant current source 3 generating a current $bI_o$, where b is a constant, between the point A and the voltage source. In addition, between the point B and the ground, there is a constant current source 4 generating a current $cI_o$, where c is a constant, instead of the transistors M9 and M10 shown in FIG. 5. The differential pair composed of the transistors M5 and M6 is driven by the constant current source 4.

The transistor M14 is supplied with a current equal in value to the sum ($bI_o - \Delta I_{QC}$) of the differential output current $-\Delta I_{QC}$ of the quadritail circuit and the constant current $bI_o$. Then, the following equations (18) and (19) are obtained due to Kirchhoff's law.

$$I_{D1} + I_{D2} + bI_o - \Delta I_{QC} = cI_o \quad (18)$$

$$I_{D5} + I_{D6} = (c-b)I_o + \Delta I_{QC} \quad (19)$$

Accordingly, the differential output current $i(\Delta I_D)$ of the differential amplifier circuit, which is derived through the active load of the transistors M7 and M8, is expressed as the following equation (20) similar to the equation (15).

$$i = v[k\{4(I_{D5} + I_{D6}) - kv^2\}]^{\frac{1}{2}} \quad (20)$$

With the differential amplifier circuit of the third embodiment, the same equation as the equation (16) can be obtained, so that the circuit has the same input-output characteristics as shown in FIG. 6.

The constants b and c are required to satisfy the relationships of $b \geq 1$ and $c - b \geq 0$. Preferably, the constants b and c are set as $b = 1$ and $c = 2$ since the input voltage range in which the transconductance is linear becomes the widest.

There is an advantage that the input voltage range in which the linearity of the transconductance is good can be changed by adjusting the current values of the current sources.

Figure 1:
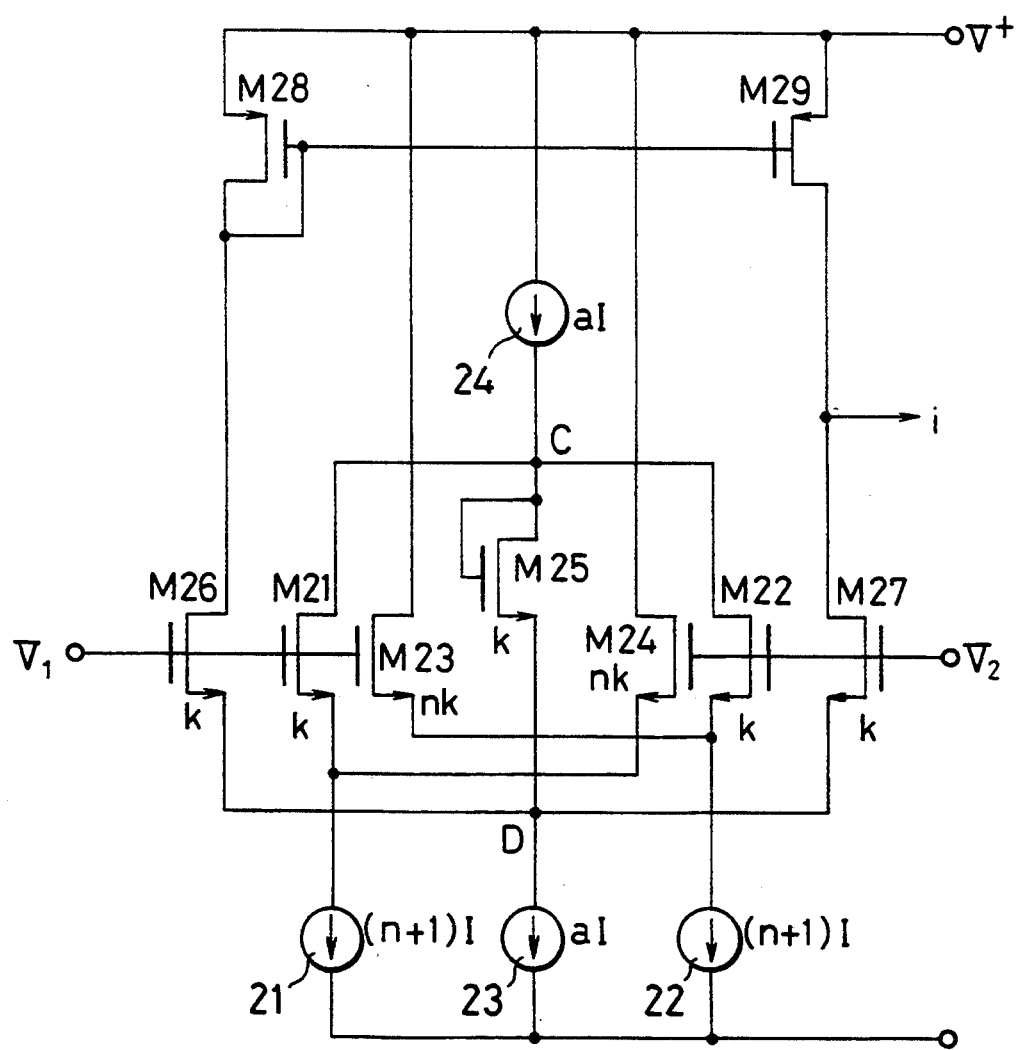
FIG. 1 is a circuit diagram of a conventional differential amplifier circuit.

The circuit of the third embodiment is similar in configuration to the conventional one shown in FIG. 1, however, it has an improved linearity of the transconductance and can be realized on CMOS integrated circuits easily.

FOURTH EMBODIMENT

Figure 9:
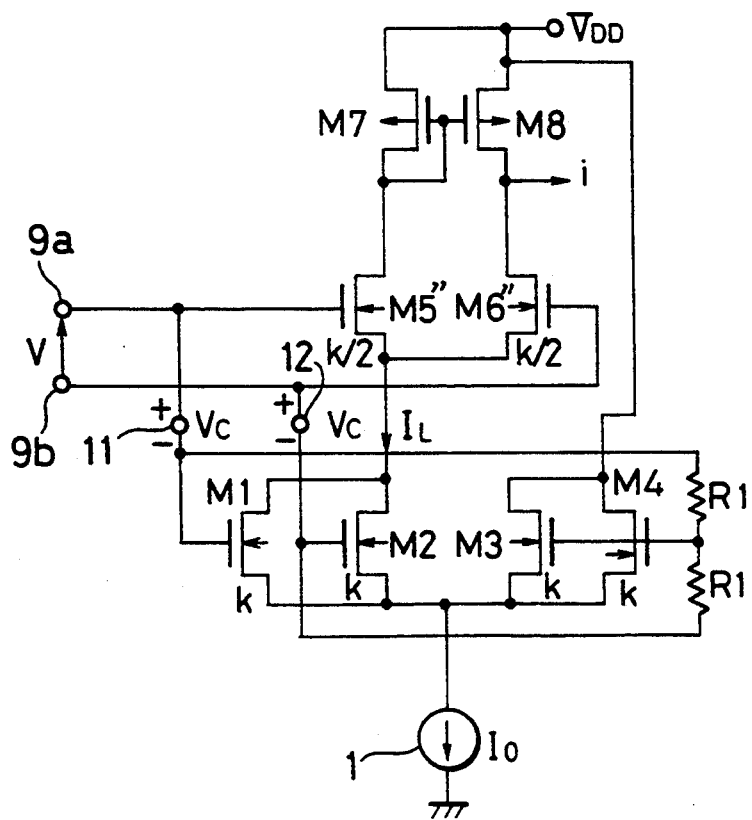
FIG. 9 is a circuit diagram of a differential amplifier circuit according to a fourth embodiment.

FIG. 9 shows a differential amplifier circuit of a fourth embodiment, in which the active load for the differential pair, which is composed of the transistors M7 and M8, a differential pair composed of transistors M5" and M6" the transistors M1 M2, M3 and M4 forming the quadritail circuit, and the constant current source (current: $I_o$) are stacked in this order between the voltage source and the ground.

The quadritail circuit is similar in configuration to the first embodiment in FIG. 5 except for the following:

The gate of the transistor M1 is connected to the terminal 9a of the input terminal pair through a DC voltage source 11 (voltage: $V_C$) acting as a voltage level adjuster. Thus, the common-connected gates of the transistors M3 and M4 are also connected to the terminal 9a through the DC voltage source 11 and the first resistor.

Similarly, the gate of the transistor M2 is connected to the terminal 9b of the input terminal pair through a DC voltage source (voltage: $V_C$) 12 acting as a voltage level adjuster. The common-connected gates of the transistors M3 and M4 are also connected to the terminal 9a through the DC voltage source 12 and the second resistor.

The voltage sources 11 and 12 are provided so that their positive ends are connected to the terminals 9a and 9b respectively, as shown in FIG. 9.

with the differential pair, it is different from the first embodiment in that the transistors M5" and M6" have the transconductance parameters (k/2) as well as it is driven by the output current $I_L$ of the quadritail circuit.

The differential input voltage v is applied between the gates of the transistors M5" and M6" and the voltage obtained by changing the voltage level of the input voltage v is applied to the gates of the transistors M1, M2, M3 and M4. The amount of voltage change is set in accordance with the difference of their transconductance parameters.

With the differential amplifier circuit of the fourth embodiment, the same input-output characteristics as shown in FIG. 6 can be obtained. In addition, there is an disadvantage that the voltage $V_{DD}$ of the voltage source is required to be a little higher than those of the first to third embodiments, however, the differential circuit is driven by the output current $I_o$ of the quadritail circuit, so that there is an additional advantage that current consumption can be reduced compared with the first to third embodiments.

FIFTH EMBODIMENT

Figure 10:
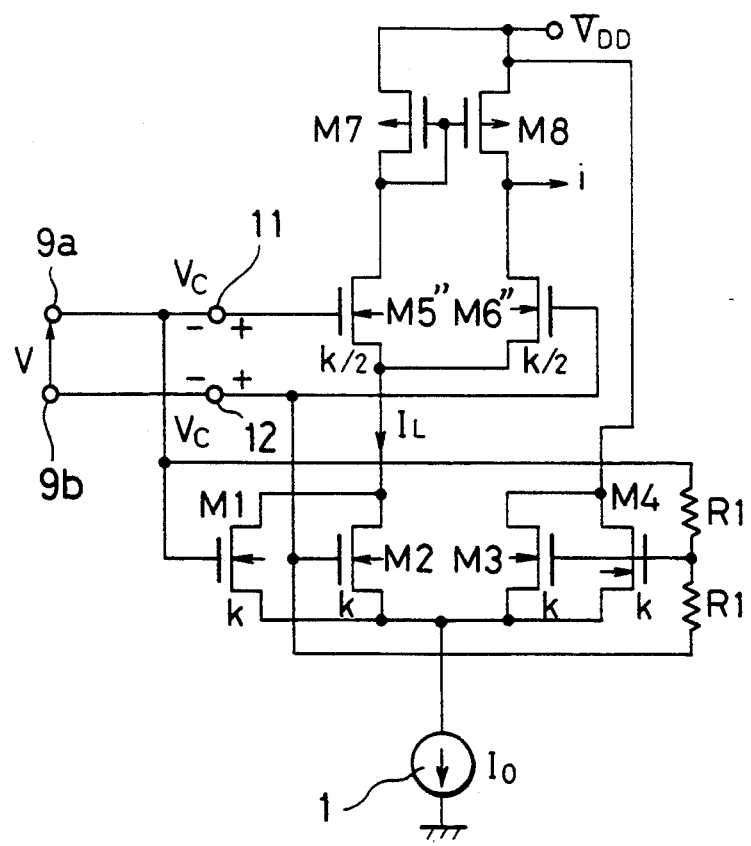
FIG. 10 is a circuit diagram of a differential amplifier circuit according to a fifth embodiment.

FIG. 10 shows a differential amplifier circuit of a fifth embodiment, which is similar in configuration to the fourth embodiment excepting that the DC voltage sources 11 and 12 acting as voltage level adjusters are provided on the sides of the transistors M5" and M6".

The differential input voltage v is applied between the gates of the transistors M1 and M2 and the voltage obtained by changing the voltage level of the input voltage v is applied to the gates of the transistors M5" and M6".

The voltage sources 11 and 12 are provided so that their negative ends are connected to the terminals 9a and 9b respectively, as shown in FIG. 10.

As described above, the MOS quadritail circuit has the wider input voltage range generating the exact square-law characteristic than the prior art although it is simple in configuration. Therefore, with the differential amplifier circuits of the first to fifth embodiments, there are an advantages that linearity of their transconductances can be improved.

In addition, since the transistor pair is composed of MOS transistors having the same transconductance parameter, the problems of the prior art do not occur and therefore, the differential amplifier circuits of these embodiments can be realized on CMOS integrated circuits easily.

Further in addition, in the quadritail circuit, the transistors M3 and M4 have sources, drains and gates connected in common, respectively. Therefore, one MOS transistor which is twice in capacity or transconductance parameter as much as the transistor M3 or M4 may be used in place of the pair of the transistors M3 and M4.

What is claimed is:

1. A differential amplifier circuit comprising:
   a quadritail circuit and a differential circuit;
   said quadritail circuit including a first transistor pair of first and second MOS transistors, a second transistor pair of third and fourth MOS transistors, and a constant current source for driving said first and second transistor pairs;
   drains of said first and second transistors being connected in common, drains of said third and fourth transistors being connected in common, and sources of said first to fourth transistors being connected in common to said constant current source; and
   said differential circuit being composed of fifth and sixth MOS transistors and being driven by a current twice in value as much as an output current of said quadritail circuit;
   wherein an input voltage is differentially applied between gates of said first and second transistors and between gates of said fifth and sixth transistors, respectively;
   a DC voltage is applied to common-connected gates of said third and fourth transistors of said second transistor pair; and
   an output current of the differential amplifier circuit being derived from an output end of said differential circuit.

2. A differential amplifier circuit as claimed in claim 1, further comprising:
   a first resistor connected between said gates of said third and fourth transistors and said gate of said first transistor; and
   a second resistor connected between said gates of said third and fourth transistors and said gate of said second transistor;
   wherein said DC voltage is generated by using said first and second resistors.

3. A differential amplifier circuit as claimed in claim 1, further comprising:
   a seventh MOS transistor which is driven by said output current of said quadritail circuit, and
   eighth and ninth MOS transistors connected in parallel and driven by said seventh MOS transistor, said eighth and ninth MOS transistors having transconductances equal to each other;
   wherein and said driving current for said differential circuit is generated by said eighth and ninth MOS transistors.

4. A differential amplifier circuit comprising:
   a quadritail circuit and a differential circuit;
   said quadritail circuit including a first transistor pair of first and second MOS transistors, a second transistor pair of third and fourth MOS transistors, and a first constant current source for driving said first and second transistor pairs;
   drains of said first and second transistors being connected in common, drains of said third and fourth transistors being connected in common, and sources of said first to fourth transistors being connected in common to said first constant current source; and
   said differential circuit being composed of fifth and sixth MOS transistors and being driven by a current equal in value to sum of current of said first constant source and an output current of said quadritail circuit;
   wherein an input voltage is differentially applied between gates of said first and second transistors and between gates of said fifth and sixth transistors, respectively;
   a DC voltage is applied to common-connected gates of said third and fourth transistors of said second transistor pair; and
   an output current of the differential amplifier circuit being derived from an output end of said differential circuit.

5. A differential amplifier circuit as claimed in claim 4, further comprising:
   a first resistor connected between said gates of said third and fourth transistors and said gate of said first transistor; and a second resistor connected between said gates of said third and fourth transistors and said gate of said second transistor;

wherein said DC voltage is generated by using said first and second resistors.

6. A differential amplifier circuit as claimed in claim 4, further comprising:

a seventh MOS transistor which is driven by said output current of said quadritail circuit, and an eighth MOS transistor and a second constant current source connected in parallel for generating said driving current of said differential pair;

wherein said eighth MOS transistor and said second constant current source are connected to common-connected sources of said fifth and sixth transistors of said differential circuit, and said second constant current source generates a constant current equal in value to that of said first constant current source.

7. A differential amplifier circuit as claimed in claim 6, further comprising a current mirror circuit composed of MOS transistors acting as an active load of said quadritail circuit, said output current of said quadritail circuit is derived through said current mirror circuit.

8. A differential amplifier circuit comprising:

a quadritail circuit including a first transistor pair of first and second MOS transistors, a second transistor pair of third and fourth MOS, transistors, and a first constant current source for driving said first and second transistor pairs;

drains of said first and second transistors being connected in common, drains of said third and fourth transistors being connected in common, and sources of said first to fourth transistors being connected in common to said first constant current source;

a second constant current source connected to said common-connected drains of said first and second transistors;

a differential circuit composed of fifth an sixth MOS transistors;

a third constant current source for driving said differential pair, said third constant current source being connected to said common-connected drains of said first and second transistors; and a current level shifter for shifting a current level between said common-connected drains of said first and second transistors and common-connected sources of said fifth and sixth transistors;

wherein an input voltage is differentially applied between gates of said first and second transistors and between gates of said fifth and sixth transistors, respectively;

a DC voltage is applied to common-connected gates of said third and fourth transistors of said second transistor pair; and an output current of the differential amplifier circuit being derived from an output end of said differential circuit.

9. A differential amplifier circuit as claimed in claim 8, further comprising:

a first resistor connected between said gates of said third and fourth transistors and said gate of said first transistor; and a second resistor connected between said gates of said third and fourth transistors and said gate of said second transistor;

wherein said DC voltage is generated by using said first and second resistors.

10. A differential amplifier circuit as claimed in claim 9, further comprising a current mirror circuit composed of MOS transistors acting as an active load of said quadritail circuit, an output current of said quadritail circuit is derived through said current mirror circuit.

11. A differential amplifier circuit as claimed in claim wherein a constant current of said first constant current source is $I_0$, and those of said second and third constant current sources are $bI_0$ and $cI_0$, respectively, where b and c are constants, and said constants b and c satisfy relationships of $b \geqq 1$ and $c - b \geqq 0$.

12. A differential amplifier circuit as claimed in claim wherein $b = 1$ and $c = 2$.

13. A differential amplifier circuit comprising:

a quadritail circuit and a differential circuit;

said quadritail circuit including a first transistor pair of first and second MOS transistors, a second transistor pair of third and fourth MOS transistors, and a first constant current source for driving said first and second transistor pairs;

drains of said first and second transistors being connected in common, drains of said third and fourth transistors being connected in common, and sources of said first to fourth transistors being connected in common to said constant current source; and said differential circuit being composed of fifth and sixth MOS transistors and being driven by a current equal in value to an output current of said quadritail circuit;

wherein an input voltage is differentially applied between gates of said fifth and sixth transistors and a voltage obtained by changing a voltage level of said input voltage is differentially applied between gates of the first and second transistors;

a DC voltage generated from said level-changed voltage is applied to common-connected gates of said third and fourth transistors of said second transistor pair; and an output current being derived from an output end of said differential circuit.

14. A differential amplifier circuit comprising:

a quadritail circuit and a differential circuit;

said quadritail circuit including a first transistor pair of first and second MOS transistors, a second transistor pair of third and fourth MOS transistors, and a first constant current source for driving said first and second transistor pairs;

drains of said first and second transistors being connected in common, drains of said third and fourth transistors being connected in common, and sources of said first to fourth transistors being connected in common to said constant current source; and said differential circuit being composed of firth and sixth MOS transistors and being driven by a current equal in value to an output current of said quadritail circuit;

wherein an input voltage is differentially applied between gates of said first and second transistors and a voltage obtained by changing a voltage level of said input voltage is differentially applied between gates of the fifth and sixth transistors;

a DC voltage generated from said input voltage is applied to common-connected gates of said third and fourth transistors of said second transistor pair; and an output current being derived from an output end of said differential circuit.

15. A differential amplifier circuit as claimed in claim 13 or 14, further comprising:
a first resistor connected between said gates of said third and fourth transistors and said gate of said first transistor; and
a second resistor connected between said gates of said third and fourth transistors and said gate of said second transistor;
wherein said DC voltage is generated by using said first and second resistors.

16. A differential amplifier circuit as claimed in claim 13 or 14, wherein transconductance parameters of said fifth and sixth transistors are different from those of said first to fourth transistors.

* * * * *

UNITED STATES PATENT AND TRADEMARK OFFICE
CERTIFICATE OF CORRECTION

PATENT NO. : 5,381,113
DATED : January 10, 1995
INVENTOR(S) : Katsuji Kimura

It is certified that error appears in the above-identified patent and that said Letters Patent is hereby corrected as shown below:

Column 3, line 42, delete "{v{", and insert --|v|--;

Column 8, line 35, delete "MS", and insert --M8--;

Column 10, line 67, delete "with", and insert --With--;

Column 14, line 6, after "claim", insert --8--;

Column 14, line 12, after "claim", insert --11--;

Signed and Sealed this

Twelfth Day of March, 1996

Attest:

BRUCE LEHMAN

*Attesting Officer*     *Commissioner of Patents and Trademarks*